United States Patent [19]

Kirk et al.

[11] 4,012,768
[45] Mar. 15, 1977

[54] SEMICONDUCTOR PACKAGE

[75] Inventors: Glenn E. Kirk, Mesa; Alfred L. Medesha, Apache Junction, both of Ariz.

[73] Assignee: Motorola, Inc., Chicago, Ill.

[22] Filed: Feb. 3, 1975

[21] Appl. No.: 546,245

[52] U.S. Cl. .................................. 357/72; 357/70; 357/81

[51] Int. Cl.² ............... H01L 23/28; H01L 23/48; H01L 23/02

[58] Field of Search ..................... 357/70, 72, 81

[56] References Cited

UNITED STATES PATENTS

| 3,629,668 | 12/1971 | Hingorany | 357/70 |
| 3,820,153 | 6/1974 | Quinn | 357/81 |

Primary Examiner—Edward J. Wojciechowicz
Attorney, Agent, or Firm—Robert A. Farley

[57] ABSTRACT

A high heat dissipating integrated circuit device having a large heat sink metalic portion surrounding the plastic encapsulation material of the semiconductor chip. The semiconductor chip is mounted in electrically insulated, close conjunction with the heat sink such that high heat dissipation is provided. The heat sink portion is conveniently formed surrounding most of the plastic encapsulation to provide for maximum heat dissipation from the device. The device provides for heat dissipation in the ten to higher watt range.

5 Claims, 5 Drawing Figures

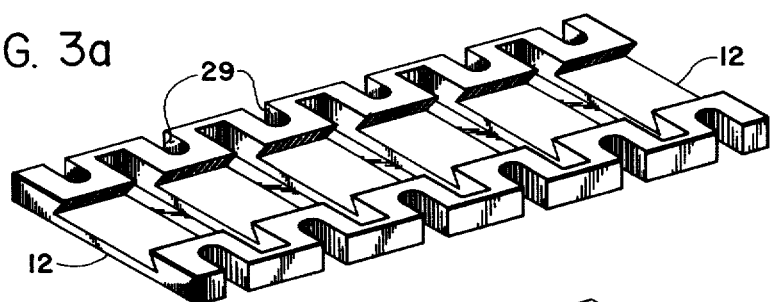
FIG. 3a
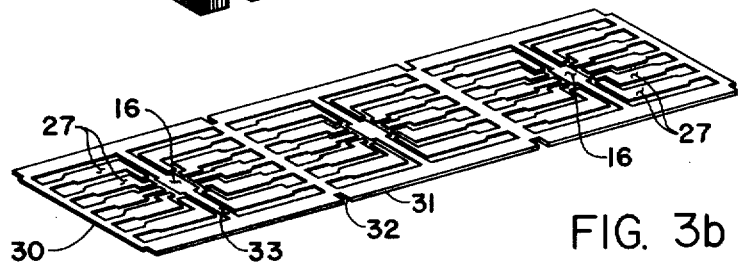
FIG. 3b
FIG. 4
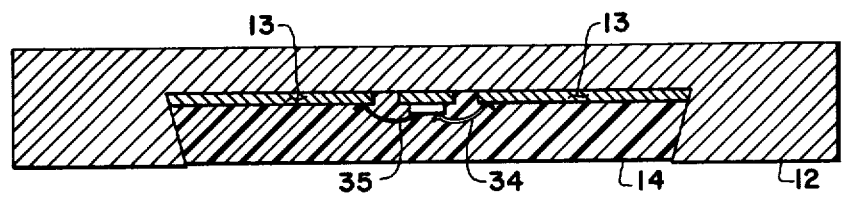

4,012,768

SEMICONDUCTOR PACKAGE

BACKGROUND OF THE INVENTION

This invention relates to semiconductor devices encapsulated in plastic material and more particularly to improved integrated circuit power devices such as integrated circuits of the linear type for television purposes in which substantial amounts of internally generated heat must be dissipated during the circuit operation.

Because the active device commonly called the chip or die of a semiconductor integrated circuit devices is very small, the removal from the chip of heat generated during operation thereof has consistently been an important consideration in the overall device construction. Previously a high heat conductivity ceramic or a metal encapsulating medium having high heat conductivity capabilities were generally utilized for devices of so high a power.

With plastic encapsulation the dissipation of heat through the plastic packaging medium is relatively poor because of the relatively low thermal conductivity properties of the plastic. To remove the heat produced during operation of the device metal tabs that protrude from one end of the plastic packaging have been provided for coupling to a larger heat sink. Generally a large metal tab is utilized because the flow of heat from the die or chip is then directed through a substantial length of reduced cross section having poor heat transfer characteristics. Accordingly the size of the package has been substantially increased to compensate for the size of the heat sink.

SUMMARY OF THE INVENTION

An object of the invention is to reduce the overall size of the plastic encapsulated integrated circuit device while at the same time increase the power handling capabilities of the device.

A further object of the invention is to provide a plastic encapsulated semiconductor integrated circuit device wherein satisfactory dissipation during operation of the device is achieved through a metal heat dissipating surface which is a relatively integral part of a metal element of the complete device and yet wholly within its outlines and thus having no external portions extending outside the outlines of the plastic housing.

A still further object of the invention is to provide a device wherein the forming and handling of the metal portion and the plastic molding portion may be relatively automated and yet the molding can be accomplished to provide an exposed metal surface flush with the outline of the molded plastic.

A feature of the invention is the provision of a plastic encapsulated integrated circuit device in which a major portion of one face of the device includes a surface which is wholly of metal utilized for supporting the semiconductor device. Openings normal to this surface of the mounting portion extend through the device for affixing that surface to a circuit board. The metal of the heat sink is insulated from the semiconductor chip and therefore does not interfere with the electrical operation of the device. The surface of the metal heat sink is flush with the plastic comprising the balance of the surfaces of the device package. A larger body of metal or mounting means may serve as a large heat sink when the device is mounted.

THE DRAWINGS

Further objects and advantages of the invention will be understood from the following complete description and the drawings thereof wherein:

FIGS. 3a and 3b are perspective views of the metal lead frame in accordance with the invention and the heat sink indicating the relative relationship of the parts; and FIG. 4 is a cross-sectional view through the center of the completed device.

COMPLETE DESCRIPTION OF THE INVENTION

The invention is embodied in the semiconductor device primarily for the use as a high power integrated circuit unit requiring substantial dissipation of internally generated heat. The device is comprised of several adjacent but physically separated metallic members lying in substantially a singular plane within at least one of the members having a mounting portion substantially larger than the balance of the metallic members. The other members terminate in the original plane adjacent but spaced longitudinally away from the mounting portion. All metallic members extend generally parallel to one another longitudinally away from the mounting portion to form leads for joining the device to an electrical or electronic circuit. The semiconductor die or chip is positioned on the mounting portion at the first surface and is connected electrically to the metallic members by a suitable means such as wires. Plastic encapsulation is disposed adjacent the chip or die connecting wires and the immediately adjacent parts of the metallic members. The encapsulation is so formed that substantially the entire segment surface of the mounting portion is exposed and a suitably high dissipation metal heat sink may insulatively be connected thereto. Openings in the mounting portion are provided for receiving suitable fastening means to mount the device in suitable electrical or electronic equipment.

Figure 1:
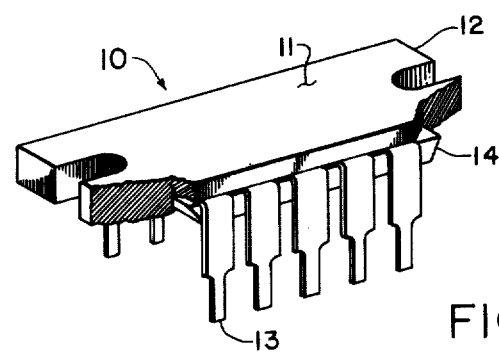
FIG. 1 is a perspective view of a semiconductor integrated circuit constructed in accordance with the invention.

A semiconductor device 10 (FIG. 1) has on the face 11 thereof which would conventionally be mounted adjacent to a metal or otherwise heat conducting chassis which face is part of a large metal heat sink mounting portion 12. Formed metal leads 13 form electrical connection to the device. While as shown the device has the metal mounting portion on the upper surface thereof, it will be appreciated that the metal leads thereof could be formed in the opposite direction so that the metal is on the lower surface.

Figure 2:
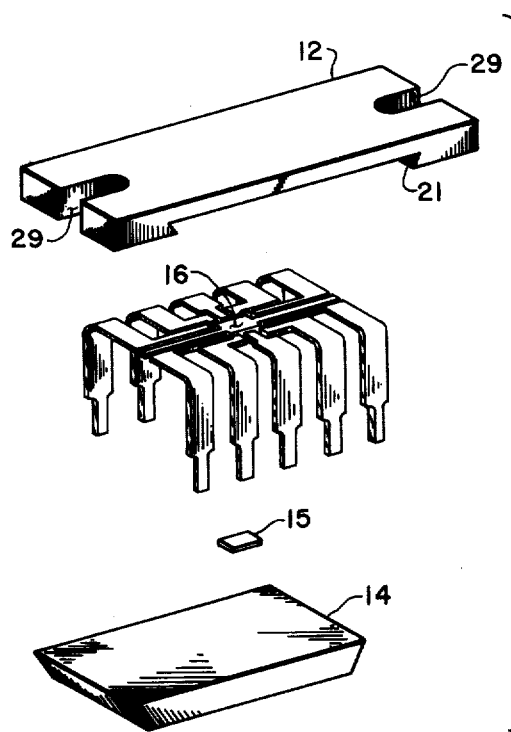
FIG. 2 is an exploded view thereof.

The heat sink 12 surrounds an encapsulated plastic portion 14 which forms the bulk of the protective surrounding for the integrated circuit device. A semiconductor chip or die 15 (FIG. 2) is mounted directly adjacent the heat sink 12 so that a good heat transfer between the two is achieved although the device is electrically insulated therefrom. When assembled in electrical or electronic equipment, this exposed surface 11 is generally coupled with a larger heat sink to provide for rapid and efficient removal of heat generated internally during the operation of the device. Numerous well known methods can be used to insulatively join the electrical lead members 13 and the mounting portion 16, as housed in plastic body 14, to the heat sink 12. For example, the recessed portion of heat sink 12 can be anodized to provide an insulating layer and a thermally conductive epoxy cement can be used to join the plastic housed lead members to heat sink 12 within the recess.

A chip mounting portion 16 may be integral with an electrical lead for the device and extend outwardly from the device but in most cases is electrically insulated from the electrical leads 13. The mounting portion 16 may be in a plane different than the electrical leads to facilitate wire bonding.

To aid in the retention of the heat sink mounting portion 12 on plastic 14, flanges 21 of the mounting portion may be bevelled upwardly at the same angle as the draft angle provided when the plastic cures in the molding operation.

The device 10 may have a plurality of leads 13, i.e., at least three comprising collector, base, and the emitter of an ordinary transistor device but which in the present context being an integrated circuit device will usually include more, ten in number being shown. All of these leads are fabricated from a metal having a low electrical resistance and a very high thermal conductivity and preferably comprise a base metal of copper plated with nickel for corrosion resistance and for facilitating with the wire bonding of the assembly operation.

The plastic 14 is preferably a low shrink filled epoxy material suitable for transfer molding. In choosing a plastic its compatibility with the components of the device and the stability of the device encapsulated therein when aged and subjected to wide variations in the environmental conditions are two considerations of prime importance. A plastic suitable for transfer molding is preferred because the resulting encapsulation is uniform, void free and tightly sealed about the elements of the device. Epoxies and silicons with or without fillers are preferred although many other well known plastics with similar properties may be utilized.

In transfer molding the plastic encapsulation for the subject device heat and pressure are applied to convert the plastic which is normally in a solid state into a very low viscosity liquid which is then rapidly transferred from one mold chamber into another normally comprising the final packaged shape. Because of this low viscosity and the nature of the transfer molding high pressures may be utilized without damaging the delicate parts (typically the bonding wires) associated with a semiconductor device. With the uniform mass formed by transfer molding the plastic encapsulation the elements of the device 11 are held in a rigid fixed relationship and generally are not subject to damage by vibrations and shocks.

The bottom surface of heat sink mounting portion 12 (FIG. 2) is intimately cemented to the bottom surface plastic 14 so that when mounted on a chassis or other structure intimate contact is maintained there between. This provides a very large heat transferring surface for dissipating heat vertically and laterally from the die or chips 15 mounted on the mounting portion 12. The resulting effect is as if the die were mounted directly on the larger heat sink giving nearly ideal heat transferring properties.

The chip or die 15 is a chip of silicon having two major faces wherein one face comprises the back or ground side of an integrated circuit and the other face has thereon the electrical leads for connecting with the collector, emitter and base of the transistors, and also various resistive and capacitive sections of the integrated circuit. All of the die 15 is preferably fabricated from silicon. It will be appreciated that in accordance with the invention that the packaging is suitable for semiconductor devices manufactured from other semiconductor materials.

The amount of heat that may be dissipated by a unit is effectively the amount that may be transferred across the boundary of the major faces. The mounting of the die or chip 15 in this manner or mounting portion 12 results in the direct flow of heat from one face of the die or chip 26, through the mounting portion to, as is the usual situation, a larger heat sink. This short, direct path for high heat transfer takes advantage of the maximum heat transferring area of the die.

The semiconductor integrated circuit device 10 is conveniently mounted by inserting a bolt or other fastener through openings 29 in mounting portion 12.

Fabrication of the semiconductor device according to the invention is facilitated by the use of metal strip 30 (FIG. 3), punched to form a plurality of interconnected groups of individual metallic members 13 and 16 included in the final device. Each group includes mounting portion 16, wire bonding areas 27, and external leads 13. The groups are joined by a heavy connecting band 31 with a plurality of openings 32 therein that are utilized to position the groups during the assembly steps as the strip is moved through the assembly machinery. To retain the individual members of device 10 in a set relationship during the assembly steps a tie strip 33 is provided immediately below portion of the chip 15 which is ultimately covered by the plastic 14. Metal strip 30 is conveniently punched, or formed by other commonly used metal forming techniques, at relatively low cost when compared with the cost of the parts serving a similar function in previous device structures. With the use of strip 30 the fabrication of device 10 is highly mechanized and the cost thereof substantially reduced. The assembly machinery utilized has an indexing means that functions in conjunction with openings 32 to consistently and precisely position the groups of metallic members for each step of the fabrication.

A strip 30 is inserted in a die bonder (not shown) and the first group aligned with mounting portion 16 under the die bonding needle. Once an initial alignment is made, the balance of the mounting portions 16 is automatically aligned under the needle in a progressive operation. Die 15 (FIG. 4) is bonded in a preselected location on each mounting portion 16 toward the edge thereof near the tie strip 32 and on the center line of the appendage. Many techniques of die bonding are known and will not be further described herein.

Strip 30 with die 15 bonded thereto corresponding in number to the groups of metallic members in the strip is transported as a unit to a wire bonding machine (not shown) and alignment is made on the first group and a fine wire 34 bonded to die 15 and a wire bonding area 27. The wire bonding is progressively repeated for each group on the strip 30. At the completion of one pass of the strip through the wire bonder, the first group is again positioned under the wire bonder and the operation repeated to bond the wire 35 to wire bonding area 27. Fine wires 34, 35 electrically couple the suitable bonding paths of the semiconductor integrated circuit device to their corresponding external leads 13. The ease and rapidity with which the die 15 is bonded and fine wires 34 and 35 are connected clearly evidence the efficient but inexpensive nature of this type of assembly.

Strip 30 now including the partially assembled semiconductor integrated circuit devices is removed from the wire bonder and transferred to a transfer mold (not shown) for plastic molding. The number of groups formed in the strip is usually selected so that the entire strip may be positioned in the transfer mold as a single unit and the mold closed there above to form individual mold cavities about each group of metallic members. Included in the cavity is mounting portions 16, die 15, fine wires 34, 35 wire bonding areas 28 and adjacent portions of leads 13.

To plastic encapsulate the illustrated embodiment of the invention, the mounting portion 16 may be disposed on one face of the mold (not shown). The semiconductor die 15 faces the opposing mold face.

With the mold closed the fluid epoxy material is transferred into the cavities to form individually encapsulated devices 10. The thermo setting epoxy material cures rapidly and a dense solid plastic encapsulation securely and tightly sealed about the protruding metallic members is formed (FIG. 4). A strip of interconnected almost completed devices 10 formed thereon is removed from the mold. The plastic material does not cover the top surface of bonding portion 16 so that upon removal from the mold this surface is exposed and flush with the surrounding face of plastic 14. It may be necessary to remove any excess material from this surface.

Strip 30 is transferred to a metal shear where it is separated along appropriate shear lines and cut off line 3 and the heat sink 12 attached thereto to complete fabrication of individual transistor device 11. These devices are categorized according to their electrical characteristics to complete the final fabrication steps. The relative position of the heat sink 12 to the mounting portion 16 is shown in the cross-sectional view FIG. 4. The heat sink is contiguous to the mounting portion 16 and extends around the plastic encapsulation to aid in retaining the mounting portion thereon. Also in FIG. 4 the relative planes of the mounting portion 16 and leads 13 are readily observed. Mounting portion 16 may be joined by an offset bend 19 that is advantageously formed during the stamping of a metallic strip if wire bonding on a single level is desired.

Because of the heat transferring properties of this novel packaging in accordance with the invention 10 watts and higher are readily accommodated in this package similar in package to the prior art devices and accommodated in the same space as previously.

With the improved heat transfer capabilities of the device according to the invention, a package that is smaller than those described may be feasible. Factors such as the temperature of the heat sink and the commercial acceptable package size influence the selection of the file and dimensions. A larger heat sink may be used. It is understood that the physical package configuration, and number of leads utilized may be readily altered within the scope of the invention.

While the invention has been described by way of the preferred embodiment thereof, it will be appreciated that suitable modifications may be made therein without departing from the spirit and scope of the invention.

What is claimed is:

1. A semiconductor integrated circuit device comprising:
   a. a plurality of metallic lead members planarly disposed in two groups on either side of a longitudinal axis;
   b. a mounting portion positioned between said two groups of metallic lead members and having a first and a second surface substantially parallel to the plane of the metallic lead members;
   c. a semiconductor chip having a first surface bonded to said first surface of said mounting portion and having a second surface having a plurality of electrodes thereon, said electrodes electrically connected to said metallic lead members;
   d. plastic encapsulation means for enclosing and holding in alignment said metallic lead members, said mounting portion and said semiconductor chip, a surface of said plastic encapsulation means being planarly coincident with said second surface of said mounting portion such that said second surface of said mounting portion is exposed; and
   e. a metallic heat sink having a recess transverse to said longitudinal axis, said recess adapted to receive said plastic encapsulation means wherein said surface of said plastic encapsulation means is insulatively joined to the surfaces of said recess with said groups of metallic lead members extending beyond the sides of said metallic heat sink.

2. A semiconductor integrated circuit device as recited in claim 1 wherein said metallic lead members extend beyond the sides of said metallic heat sink and are bent at substantially 90° relative to said second surface of said mounting portion in a direction away from said heat sink.

3. A semiconductor integrated circuit device as recited in claim 1 wherein said metallic lead members extend beyond the sides of said metallic heat sink and are bent at substantially 90° relative to said second surface of said mounting portion in a direction toward said heat sink.

4. A semiconductor integrated circuit device as recited in claim 1 wherein said mounting portion and said metallic lead members are in the same plane.

5. A semiconductor integrated circuit device as recited in claim 1 wherein said mounting portion is displaced away from the plane of said metallic lead elements in the direction of said heat sink.

* * * * *